(12) United States Patent
Adachi et al.

(10) Patent No.: US 8,405,159 B2
(45) Date of Patent: Mar. 26, 2013

(54) SEMICONDUCTOR DEVICE

(75) Inventors: Kanna Adachi, Chigasaki (JP); Shigeru Kawanaka, Yokohama (JP); Satoshi Inaba, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 12 days.

(21) Appl. No.: 13/234,536

(22) Filed: Sep. 16, 2011

(65) Prior Publication Data
US 2012/0091537 A1   Apr. 19, 2012

(30) Foreign Application Priority Data
Oct. 14, 2010 (JP) ................ 2010-231634

(51) Int. Cl.
*H01L 27/088* (2006.01)

(52) U.S. Cl. ........... 257/392; 257/393; 257/E27.098; 257/903; 257/350; 257/773; 438/197; 438/424; 365/63; 365/154; 365/155; 365/156

(58) Field of Classification Search ............ 438/424, 438/197; 257/390–393, E27.098, 903, 350, 257/773, E23.142, E27.111, 347, 369, E27.112, 257/E27.06, E21.546, 202, E29.166
See application file for complete search history.

(56) References Cited

U.S. PATENT DOCUMENTS

| | | | | |
|---|---|---|---|---|
| 5,206,533 A * | 4/1993 | Houston | ........... | 257/393 |
| 5,654,572 A * | 8/1997 | Kawase | ........... | 257/371 |
| 5,886,388 A * | 3/1999 | Wada et al. | ........... | 257/393 |
| 5,939,740 A * | 8/1999 | Hashimoto et al. | ........... | 257/213 |
| 6,479,905 B1 * | 11/2002 | Song | ........... | 257/365 |
| 6,577,021 B2 * | 6/2003 | Morishima et al. | ........... | 257/213 |
| 6,657,885 B2 * | 12/2003 | Kuriyama et al. | ........... | 365/154 |
| 6,734,573 B2 * | 5/2004 | Okada | ........... | 257/376 |
| 6,847,542 B2 * | 1/2005 | Yabe | ........... | 365/154 |
| 6,924,560 B2 * | 8/2005 | Wang et al. | ........... | 257/67 |
| 7,087,493 B1 * | 8/2006 | Madan | ........... | 438/284 |
| 7,214,572 B2 * | 5/2007 | Natsume | ........... | 438/153 |
| 2001/0028059 A1 * | 10/2001 | Emma et al. | ........... | 257/67 |
| 2002/0009002 A1 * | 1/2002 | Kumagai et al. | ........... | 365/200 |
| 2002/0067636 A1 * | 6/2002 | Kuriyama et al. | ........... | 365/154 |
| 2003/0016568 A1 * | 1/2003 | Kumagai et al. | ........... | 365/200 |

(Continued)

OTHER PUBLICATIONS

Choi, Woo Young, et al., 70-nm Impact-Ionization Metal-Oxide-Semiconductor (I-MOS) Devices Integrated with Tunneling Field-Effect Transistors (TFETSs), Electron Devices Meeting, 2005, IEEE Technical Digest, pp. 955-958.

(Continued)

*Primary Examiner* — N Drew Richards
*Assistant Examiner* — Ankush Singal
(74) *Attorney, Agent, or Firm* — Turocy & Watson, LLP

(57) ABSTRACT

In accordance with an embodiment, a semiconductor device includes an SRAM cell on a substrate. The SRAM cell includes: first and second load transistors each having an n-type source region and a p-type drain region, first and second driver transistors each having a p-type source region and an n-type drain region, and first and second transfer transistors each having an n-type source region and a n-type drain region. The n-type source regions of the first and second load transistors, the n-type drain regions of the first and second driver transistors, and the n-type source regions and the n-type drain regions of the first and second transfer transistors are located in a region other than a region present between any two of the p-type drain regions of the first and second load transistors and the p-type source regions of the first and second driver transistors.

20 Claims, 3 Drawing Sheets

U.S. PATENT DOCUMENTS

| | | |
|---|---|---|
| 2003/0133335 A1* | 7/2003 | Ohbayashi et al. ............ 365/200 |
| 2005/0012161 A1* | 1/2005 | Sato .............................. 257/393 |
| 2005/0179061 A1* | 8/2005 | Jang et al. ..................... 257/208 |
| 2006/0017181 A1* | 1/2006 | Anezaki et al. ............... 257/903 |
| 2006/0215441 A1* | 9/2006 | Matsushige et al. .......... 365/154 |
| 2007/0007603 A1* | 1/2007 | Yamada et al. ............... 257/393 |
| 2007/0223271 A1* | 9/2007 | Anezaki et al. ............... 365/182 |
| 2009/0189198 A1* | 7/2009 | Miyashita ..................... 257/255 |
| 2010/0238716 A1* | 9/2010 | Anezaki et al. ............... 365/156 |

OTHER PUBLICATIONS

Mookerjea, S., et al., "Experimental Demonstration of 100nm Channel Length InGaAs-based Vertical Inter-band Tunnel Field Effect Transistors (TFETs) for Ultra Low-Power Logic and SRAM Applications", IEEE 2009, pp. 949-951.

* cited by examiner

SEMICONDUCTOR DEVICE

CROSS REFERENCE TO RELATED APPLICATIONS

This application is based upon and claims the benefit of priority from the prior Japanese Patent Application No. 2010-231634, filed on Oct. 14, 2010, the entire contents of which are incorporated herein by reference.

FIELD

Embodiments described herein relate generally to a semiconductor device.

BACKGROUND

There has been known a conventional static random access memory (SRAM) using a field effect tunnel transistor that takes advantage of semiconductor band-to-band tunneling. Use of such a field effect tunnel transistor makes it possible to reduce a power supply voltage and reduce power consumption as compared with the use of a conventional metal insulator semiconductor field effect transistor (MISFET). However, the field effect tunnel transistor has a problem of a complex pattern of an impurity implantation region in an SRAM cell because a source region and a drain region are different in conductivity type. This causes difficulty in lithography for forming a mask for use in ion implantation, and may therefore prevent precise implantation of an impurity and vary transistor characteristics.

DETAILED DESCRIPTION

In accordance with an embodiment, a semiconductor device includes an SRAM cell on a substrate. The SRAM cell includes first and second load transistors, first and second driver transistors, and first and second transfer transistors. The first and second load transistors have an n-type source region and a p-type drain region, respectively. The first and second driver transistors have a p-type source region and an n-type drain region, respectively. The first and second transfer transistors have an n-type source region and an n-type—drain region, respectively. The n-type source regions of the first and second load transistors, the n-type drain regions of the first and second driver transistors, and the n-type source regions and the n-type drain regions of the first and second transfer transistors are located in a region other than a region present between any two of the p-type drain regions of the first and second load transistors and the p-type source regions of the first and second driver transistors.

Embodiments will now be explained with reference to the accompanying drawings.

[Embodiment]
(Configuration of Semiconductor Device)

Figure 1A:
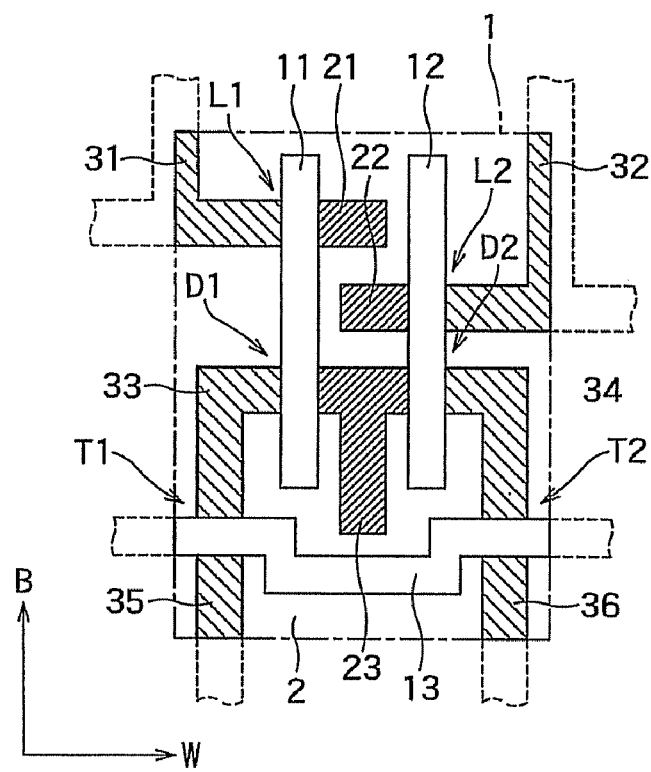
FIGS. 1A and 1B are top views schematically showing a unit cell of an SRAM cell of a semiconductor device according to an embodiment.
Figure 1B:
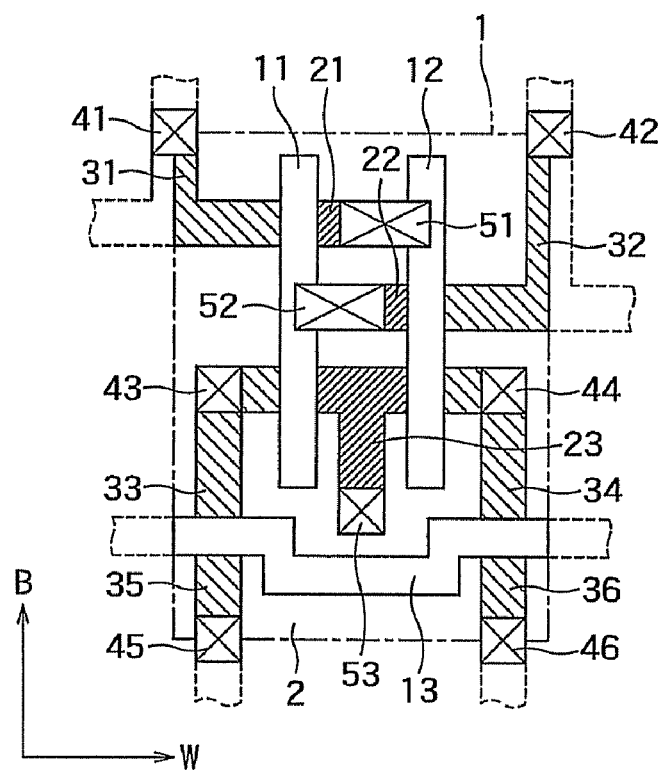

FIGS. 1A and 1B are top views schematically showing a unit cell of an SRAM cell of a semiconductor device according to an embodiment. FIG. 1A is a diagram in which contact plugs are not shown. FIG. 1B is a diagram in which the contact plugs are shown.

The semiconductor device according to the present embodiment has a 6-transistor SRAM. A unit cell 1 of the 6-transistor SRAM has n-type transfer transistors T1 and T2, n-type driver transistors D1 and D2, and p-type load transistors L1 and L2. A W-direction and B-direction in the diagrams represent the length direction of a word line and the length direction of a bit line, respectively. The driver transistors D1 and D2 and the load transistors L1 and L2 are transistors in which source regions and drain regions are different in conductivity type, and are, for example, field effect tunnel transistors that take advantage of semiconductor band-to-band tunneling.

Each of the transfer transistors T1 and T2 is a transistor in which a source region and a drain region are symmetrical, and is, for example, a planar MISFET.

The field effect tunnel transistors that take advantage of the semiconductor band-to-band tunneling have a smaller leak current in a subthreshold region than a conventional MISFET, and can therefore reduce the power supply voltage of the SRAM and reduce power consumption when used as the driver transistors D1 and D2 and the load transistors L1 and L2.

On the other hand, a current runs through the tunnel transistor substantially in one direction alone, so that a reading or writing speed is significantly low when the tunnel transistors are used for the transfer transistors. Thus, the transistor in which the source region and the drain region are symmetrical is used for each of the transfer transistors T1 and T2.

The transfer transistor T1 uses n-type impurity diffusion regions 35 and 33 as a source region and a drain region, respectively. The transfer transistor T2 uses n-type impurity diffusion regions 36 and 34 as a source region and a drain region, respectively.

The driver transistor D1 uses a p-type impurity diffusion region 23 and the n-type impurity diffusion region 33 as a source region and a drain region, respectively. The driver transistor D2 uses the p-type impurity diffusion region 23 and the n-type impurity diffusion region 34 as a source region and a drain region, respectively.

The load transistor L1 uses an n-type impurity diffusion region 31 and a p-type impurity diffusion region 21 as a source region and a drain region, respectively. The load transistor L2 uses an n-type impurity diffusion region 32 and a p-type impurity diffusion region 22 as a source region and a drain region, respectively.

The p-type impurity diffusion regions 21 to 23 and the n-type impurity diffusion regions 31 to 36 are formed in an active region which is a region on a substrate marked off by an element isolation region 2.

The substrate is made of Si-based crystal such as Si crystal in the present embodiment. However, the Si crystal substrate is not exclusively used, and, for example, a glass substrate or a ceramic substrate can also be used. The element isolation region 2 has, for example, a shallow trench isolation (STI) structure, and is filled with an insulating material such as $SiO_2$. A p-type impurity such as B or $BF_2$ can be used as an impurity to be included in the p-type impurity diffusion regions 21 to 23. An n-type impurity such as As or P can be used as an impurity to be included in the n-type impurity diffusion regions 31 to 36.

A gate electrode 11 is shared by the load transistor L1 and the driver transistor D1. A gate electrode 12 is shared by the load transistor L2 and the driver transistor D2. A gate electrode 13 is shared by the transfer transistors T1 and T2.

The gate electrodes 11 and 12 are formed on the substrate via gate insulating films, respectively. Each of the gate electrodes 11 and 12 comprises, for example, Si-based polycrystalline that contains a conducting impurity, a metal, or a stack of these materials.

Contact plugs 41, 42, 43, 44, 45, and 46 are connected to the n-type impurity diffusion regions 31, 32, 33, 34, 35, and 36, respectively. A contact plug 53 is connected to the p-type impurity diffusion region 23. Shared contact plugs 51 and 52 are connected to the p-type impurity diffusion regions 21 and 22, also gate electrode 11 and 12, respectively.

The contact plugs 41 to 46, and 53, and the shared contact plugs 51 and 52 are made of a metal such as W.

A power supply voltage (Vdd) is applied to the n-type impurity diffusion regions 31 and 32 via the contact plugs 41 and 42. A reference voltage (Vss) such as a ground voltage is applied to the p-type impurity diffusion region 23 via the contact plug 53.

The n-type impurity diffusion regions 35 and 36 are connected to the bit line via the contact plugs 45 and 46. The gate electrode 13 is connected to the word line.

The contact plug 43 and the shared contact plug 51 are connected to each other via an upper wiring line (not shown), and the gate electrode 12, the p-type impurity diffusion region 21, and the n-type impurity diffusion region 33 are connected to one another. The contact plug 44 and the shared contact plug 52 are connected to each other via another upper wiring line (not shown), and the gate electrode 11, the p-type impurity diffusion region 22, and the n-type impurity diffusion region 34 are connected to one another.

Figure 3A:
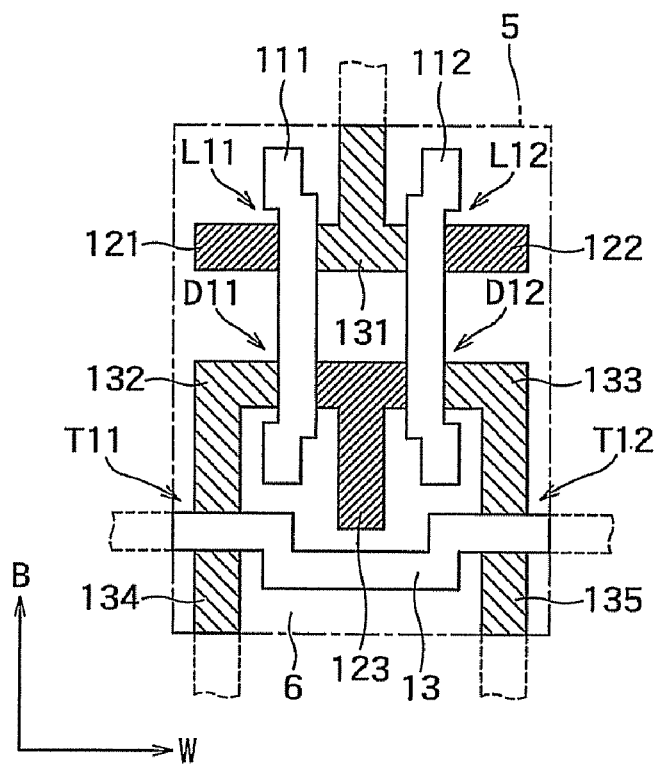
FIGS. 3A and 3B are top views schematically showing a unit cell of a 6-transistor SRAM having a conventional layout as a comparative example.
Figure 3B:
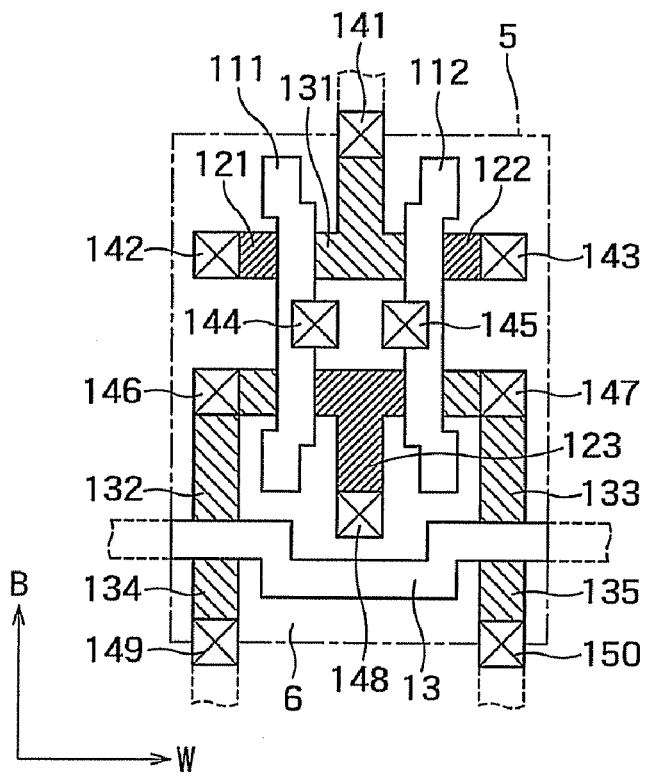

FIGS. 3A and 3B are top views schematically showing a unit cell 5 of a 6-transistor SRAM having a conventional layout as a comparative example. FIG. 3A is a diagram in which contact plugs are not shown. FIG. 3B is a diagram in which the contact plugs are shown.

The unit cell 5 is different from the unit cell 1 according to the present embodiment in the locations of load transistors. A load transistor L11 of the unit cell 5 uses an n-type impurity diffusion region 131 and a p-type impurity diffusion region 121 as a source region and a drain region, respectively. A load transistor L12 uses the n-type impurity diffusion region 131 and a p-type impurity diffusion region 122 as a source region and a drain region, respectively.

The load transistors L11 and L12 share one active region. On this active region, the p-type impurity diffusion regions 121 and 122, and the n-type impurity diffusion region 131 are formed. The p-type impurity diffusion regions 121 and 122 are arranged across the n-type impurity diffusion region 131. Therefore, the p-type impurity diffusion regions and the n-type impurity diffusion region are dispersed in the unit cell 5.

Thus, a pattern of a mask for use in ion implantation to form these impurity diffusion regions is complex, and lithography for forming the pattern is difficult As the resolution of the lithography is difficult, the edge of the pattern fluctuates.

On the other hand, in the unit cell 1 according to the present embodiment, the load transistors L1 and L2 do not share one active region, and the p-type impurity diffusion regions 21 and 22 are adjacent to each other across the element isolation region 2. Therefore, the p-type impurity diffusion regions 21, 22, and 23 are arranged together. In addition, the load transistors L1 and L2 share the active region with load transistors of another SRAM cell adjacent in the W-direction of the unit cell 1, respectively.

More specifically, none of the n-type impurity diffusion regions 31, 32, 33, 34, 35, and 36 is located between any two of the p-type impurity diffusion regions 21, 22, and 23.

Thus, the pattern of the mask for use in ion implantation to form these impurity diffusion regions is not complex, and lithography can be relatively easily conducted. As the resolution of the lithography is easy, there is less fear of the fluctuation of the edge of the pattern.

Figure 2A:
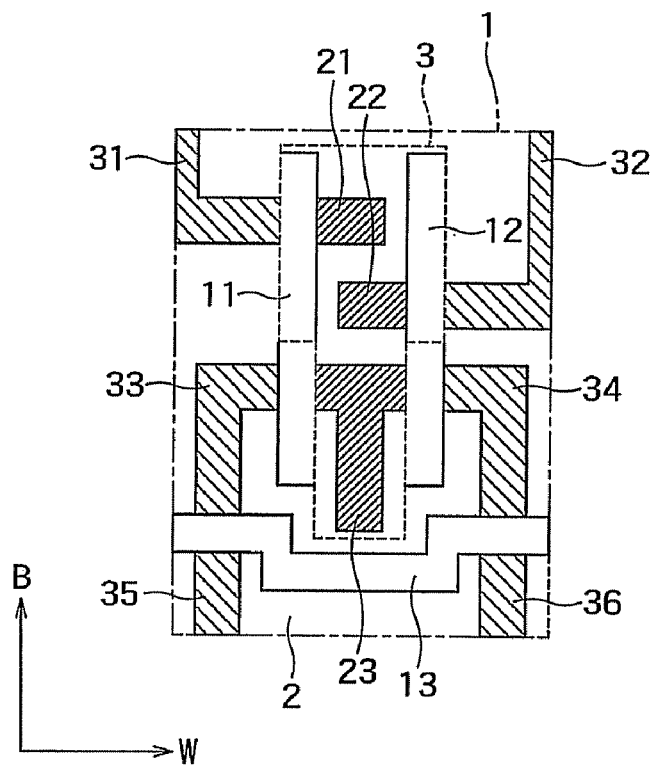
FIGS. 2A and 2B are top views schematically showing a region for ion implantation to form impurity diffusion regions.
Figure 2B:
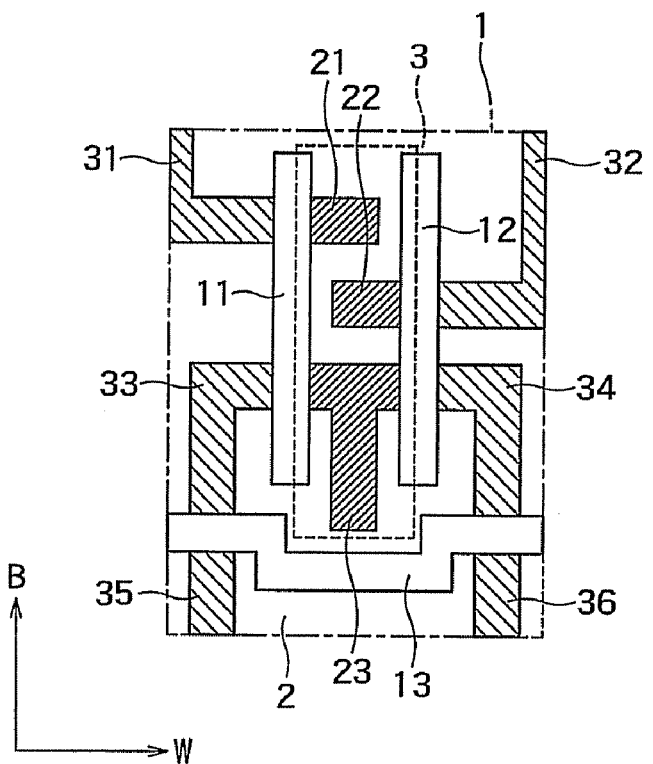

FIGS. 2A and 2B are top views schematically showing a region for ion implantation to form impurity diffusion regions. A region 3 surrounded by a dotted line represents a region into which a p-type impurity is implanted. The p-type impurity is implanted into the region 3 to form the p-type impurity diffusion regions 21 to 23. An n-type impurity is implanted into a region other than the region 3 to form the n-type impurity diffusion regions 31 to 36.

FIG. 2A shows an ion implantation region. In this ion implantation region, the p-type impurity is implanted into a region located between a region used as the gate of the load transistor L1 of the gate electrode 11 and a region used as the gate of the load transistor L2 of the gate electrode 12. The n-type impurity is implanted into a region outside a region used as the gate of the driver transistor D1 of the gate electrode 11 and outside a region used as the gate of the driver transistor D2 of the gate electrode 12.

As the p-type impurity diffusion regions 21, 22, and 23 are arranged together, the region 3 which also serves as the region into which the p-type impurity is implanted has a simple shape, and the region outside the region 3 into which the n-type impurity is implanted also has a simple shape. Thus, the mask pattern for ion implantation is simplified, and lithography can be relatively easily conducted.

FIG. 2B shows an ion implantation region wherein the region 3 is rectangular and its outline is located above the gate electrodes 11 and 12. In this case, the mask pattern for ion implantation has a simpler shape, so that lithography is easier.

In each case, to inhibit the characteristic variation of the transistors, the impurities are preferably implanted into the gate electrodes 11 and 12 before gate shape fabrication when the gate electrodes 11 and 12 are made of polycrystalline Si.

(Advantages of the Embodiment)

According to the present embodiment, the field effect tunnel transistors that take advantage of the semiconductor band-to-band tunneling are used as the driver transistors D1 and D2 and the load transistors L1 and L2, thereby reducing the power supply voltage of the SRAM and reducing power consumption.

Moreover, as the p-type impurity diffusion regions 21, 22, and 23 are arranged together, the pattern of the mask for use in ion implantation to form the impurity diffusion regions can be simplified. As a result, lithography can be relatively easily conducted, and the characteristic variation of the transistors can be inhibited. As long as the layout of the SRAM can have such advantages, the number of transistors included in the unit cell 1 does need to be six.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and sprit of the invention.

The invention claimed is:

1. A semiconductor device comprising:
an SRAM cell on a substrate,
the SRAM cell comprising
first and second load transistors each comprising an n-type source region and a p-type drain region,
first and second driver transistors each comprising a p-type source region and an n-type drain region, and
first and second transfer transistors each comprising an n-type source region and a n-type drain region,
wherein the n-type source regions of the first and second load transistors, the n-type drain regions of the first and second driver transistors, and the n-type source regions and the n-type drain regions of the first and second transfer transistors are located in a region other than a region between any two of the p-type drain regions of the first and second load transistors and the p-type source regions of the first and second driver transistors.

2. The device of claim 1,
wherein the SRAM cell comprises a first region for n-type ion implantation, and a second region for p-type ion implantation surrounding the first region,
the first region comprises the n-type source regions of the first and second load transistors, the n-type drain regions of the first and second driver transistors, and the n-type source regions and the n-type drain regions of the first and second transfer transistors, and
the second region comprises the p-type drain regions of the first and second load transistors and the p-type source regions of the first and second driver transistors.

3. The device of claim 1,
wherein the first and second load transistors and the first and second driver transistors are transistors in which the source regions and the drain regions are different in conductivity type.

4. The device of claim 1,
wherein the first and second load transistors share no active region.

5. The device of claim 1,
wherein each of the first and second transfer transistors is a transistor in which a source region and a drain region are symmetrical.

6. The device of claim 1, further comprising
a bit line connected to the n-type source regions of the first and second transfer transistors via first and second contact plugs, respectively.

7. The device of claim 1, further comprising
a first shared contact plug connected to the p-type drain region of the first load transistor and a gate electrode of the second load transistor, and
a second shared contact plug connected to the p-type drain region of the second load transistor and a gate electrode of the first load transistor.

8. The device of claim 1,
wherein a power supply voltage is applied to the n-type source regions of the first and second load transistors via third and fourth contact plugs, respectively.

9. The device of claim 1,
wherein a reference voltage is applied to the n-type source regions of the first and second driver transistors via fifth and sixth contact plugs, respectively.

10. The device of claim 2,
wherein the first and second load transistors comprise first and second gate electrodes extending parallel to each other, respectively,
the first and second driver transistors comprise third and fourth gate electrodes extending parallel to each other, respectively, and
a peripheral edge of the first region is located at outer ends of the first and second gate electrodes in the width direction thereof in regions of the first and second load transistors, and located at inner ends of the third and fourth gate electrodes in regions of the first and second load transistors.

11. The device of claim 2,
wherein the first and second load transistors comprise first and second gate electrodes extending parallel to each other, respectively,
the first and second driver transistors comprise third and fourth gate electrodes extending parallel to each other, respectively, and
a peripheral edge of the first region is located in regions of the top faces of the first to fourth gate electrodes.

12. The device of claim 10,
wherein the first and third gate electrodes are gate electrodes integrally formed to be shared by the first load transistor and the first driver transistor.

13. The device of claim 10,
wherein the second and fourth gate electrodes are gate electrodes integrally formed to be shared by the second load transistor and the second driver transistor.

14. The device of claim 3,
wherein the first and second load transistors and the first and second driver transistors are field effect tunnel transistors.

15. The device of claim 4, further comprising
a word line connected to the gate electrodes of the first and second transfer transistors.

16. The device of claim 15,
wherein the first and second load transistors share an active region together with load transistors of another SRAM cell adjacent to one SRAM in the longitudinal direction of the word line of the one SRAM, respectively.

17. The device of claim 5,
wherein each of the first and second transfer transistors is a planar MISFET.

18. The device of claim 12,
wherein each of the gate electrodes is made of Si-based polycrystalline, a metal, or a stack of these materials, the Si-based polycrystalline containing a conducting impurity.

19. The device of claim 13,
wherein each of the gate electrodes is made of Si-based polycrystalline, a metal, or a stack of these materials, the Si-based polycrystalline containing a conducting impurity.

20. The device of claim 19,
wherein the first and second transfer transistors share the same gate electrode.

* * * * *